United States Patent [19]

Roesner et al.

[11] Patent Number: 5,740,013
[45] Date of Patent: Apr. 14, 1998

[54] ELECTRONIC DEVICE ENCLOSURE HAVING ELECTROMAGNETIC ENERGY CONTAINMENT AND HEAT REMOVAL CHARACTERISTICS

[75] Inventors: Arlen L. Roesner, Fort Collins; Guy R. Wagner, Loveland; Samuel M. Babb, Fort Collins, all of Colo.

[73] Assignee: Hewlett-Packard Company, Palo Alto, Calif.

[21] Appl. No.: 676,602

[22] Filed: Jul. 3, 1996

[51] Int. Cl.[6] ................................ H05K 7/20; H05K 9/00
[52] U.S. Cl. .................. 361/697; 174/35 R; 174/35 GC;
174/51; 361/704; 361/707; 361/715; 361/720;
361/816
[58] Field of Search ........................ 174/16.3, 35 R,
174/35 GC, 51 R; 257/706–707, 712–713,
718–719, 726–727; 361/690, 697, 704,
707–710, 715, 717–721, 816, 818

[56] References Cited

U.S. PATENT DOCUMENTS

| | | |
|---|---|---|
| 3,686,533 | 8/1972 | Garnier et al. |
| 4,194,556 | 3/1980 | Watanabe et al. |
| 4,233,644 | 11/1980 | Hwang et al. |
| 4,489,363 | 12/1984 | Goldberg. |
| 4,541,004 | 9/1985 | Moore. |
| 4,546,405 | 10/1985 | Hultmark et al. |
| 4,611,238 | 9/1986 | Lewis et al. |
| 4,620,216 | 10/1986 | Horvath. |
| 4,621,304 | 11/1986 | Oogaki .................. 361/7.4 |
| 4,639,829 | 1/1987 | Ostergren et al. |
| 4,662,830 | 5/1987 | Pottebaum. |
| 4,682,651 | 7/1987 | Gabuzda. |
| 4,715,430 | 12/1987 | Arnold et al. |
| 4,733,293 | 3/1988 | Gabuzda. |
| 4,812,733 | 3/1989 | Tobey. |
| 4,970,579 | 11/1990 | Aridt et al. |
| 5,000,254 | 3/1991 | Williams. |
| 5,019,880 | 5/1991 | Higgins, III. |
| 5,029,236 | 7/1991 | Yasuda et al. |
| 5,160,807 | 11/1992 | Fry et al. .................. 174/35 R |
| 5,191,230 | 3/1993 | Heung. |
| 5,272,599 | 12/1993 | Koenen. |

(List continued on next page.)

FOREIGN PATENT DOCUMENTS

| | | |
|---|---|---|
| 2743708 | 4/1979 | Germany. |
| 63-113460 | 7/1988 | Japan. |
| 286900 | 11/1990 | Japan. |
| 229492 | 10/1991 | Japan. |
| PCT/US92/08709 | 10/1992 | WIPO. |
| WO93/08600 | 4/1993 | WIPO. |

OTHER PUBLICATIONS

U.S. application No. 08/593,185 filed Feb. 1, 1996 for Fan Assisted Heat Sink Device of Guy R. Wagner.
Literature re Thermaloy TCM™ by Thermalloy, Inc., (no date).
"Velox Backgrounder" by Velox Computer Technology, Inc., (no date).
R. Mitchell, "The Experimental Step 486/50 Redefines Cool", *BYTE*, Dec. 1990.
"ICEJET™", 50 MHz 486 Computer System Board, By Velox Computer Technology, Inc., (no date).
Literature re Velox "ICECAP™" by Velox Computer Technology, Inc., (no date).

*Primary Examiner*—Gregory D. Thompson

[57] ABSTRACT

An enclosure for integrated circuit devices is disclosed. The enclosure includes a first portion which substantially encloses a plurality of secondary, relatively low-power integrated circuit devices and which includes a mechanism for contacting the secondary integrated circuit devices in order to conduct heat away. The enclosure also includes a second portion, which may include an active cooling device, directly in contact with a primary, relatively high-power primary integrated circuit device. In addition to removing heat, the first and second enclosure portions together shield the integrated circuit devices to contain electromagnetic energy generated by the devices. The first and second enclosure portions also allow different levels of force to be applied to the primary and secondary devices.

30 Claims, 12 Drawing Sheets

U.S. PATENT DOCUMENTS

| | | |
|---|---|---|
| 5,287,249 | 2/1994 | Chen . |
| 5,288,203 | 2/1994 | Thomas . |
| 5,297,617 | 3/1994 | Herbert . |
| 5,299,632 | 4/1994 | Lee . |
| 5,309,953 | 5/1994 | Bailey . |
| 5,335,722 | 8/1994 | Wu . |
| 5,353,863 | 10/1994 | Yu . |
| 5,484,262 | 1/1996 | Thomas et al. . |
| 5,566,052 | 10/1996 | Husher ................................ 174/35 GC |

ELECTRONIC DEVICE ENCLOSURE HAVING ELECTROMAGNETIC ENERGY CONTAINMENT AND HEAT REMOVAL CHARACTERISTICS

FIELD OF THE INVENTION

The present invention relates generally to electronic device enclosures and, more particularly, to electronic device enclosures having the ability to contain electromagnetic energy and remove heat generated by electronic devices during operation.

BACKGROUND OF THE INVENTION

Integrated circuit devices are increasingly being used in modern electronic applications. One prevalent example of such an application is the computer. A typical computer may, for example, include a relatively large central processing unit which may be surrounded by a plurality of secondary electronic components such as cache SRAM memory devices. Both the central processing unit and the secondary components are generally constructed as integrated circuit devices which are mounted on a printed circuit board.

Integrated circuit devices inherently emit electromagnetic radiation during operation. This electromagnetic radiation may cause interference with communication devices, such as telephones, radios, and televisions. As the power and sophistication of integrated circuit devices have increased, so has the level of electromagnetic interference generated by such devices.

In order to prevent the interference described above, integrated circuit devices are often shielded in order to reduce or eliminate the electromagnetic radiation which is able to escape from the electronic component. To produce such shielding in a computer, for example, both the central processing unit and the secondary electronic components may be encased in an electrically conductive enclosure in order to block the emission of electromagnetic radiation.

During normal operation, integrated circuit devices also generate significant amounts of heat. If this heat is not continuously removed, the integrated circuit device may overheat, resulting in damage to the device and/or a reduction in operating performance. Along with an increase in electromagnetic radiation, the increased power and sophistication of integrated circuit devices over the years has also resulted in an increase in heat generated by the devices and, thus, increases the difficulty of cooling the devices.

In order to accomplish such heat removal, integrated circuit cooling devices are often used in conjunction with integrated circuit devices. One example of such a cooling device is a fan assisted heat sink cooling device. In such a device, a heat sink is formed of a material, such as aluminum, which readily conducts heat. The heat sink is usually placed on top of and in contact with the integrated circuit device. Due to this contact, heat generated by the integrated circuit is conducted into the heat sink and away from the integrated circuit.

The heat sink may include a plurality of cooling fins in order to increase the surface area of the heat sink and, thus, maximize the transfer of heat from the heat sink into the surrounding air. In this manner, the heat sink is able to draw heat away from the integrated circuit and transfer the heat into the surrounding air.

In order to enhance the cooling capacity of such a heat sink device, an electrically powered fan is often mounted in proximity to the heat sink. In operation, the fan causes air to move over and around the fins of the heat sink device, thus cooling the fins by enhancing the transfer of heat from the fins into the ambient air.

An example of a fan assisted heat sink device which may be used to cool electronic components is described in U.S. patent application Ser. No. 08/593,185, filed Feb. 1, 1996 of Guy R. Wagner for FAN ASSISTED HEAT SINK DEVICE which is hereby specifically incorporated by reference for all that is disclosed therein.

It has been found, however, that the use of an electromagnetic containment enclosure, in a manner as previously described, interferes with the ability of an integrated circuit cooling device, such as a fan assisted cooling device, to adequately cool the integrated circuit device located within the containment enclosure. As previously described, it is necessary for a cooling device to be in direct contact with the integrated circuit device in order for the cooling device to efficiently conduct heat away from the integrated circuit device. Because the electromagnetic containment enclosure must completely surround the integrated circuit device, however, the cooling device would have to be located within the electromagnetic enclosure in order to be in contact with the electronic circuit device being cooled. Locating the cooling device within the enclosure in this manner would interfere with the ability of the cooling device to transfer heat into the surrounding air and, thus, would prevent the cooling device from efficiently cooling the electronic component.

It has also been found that the mounting mechanisms for integrated circuit devices often interfere with the optimum operation of integrated circuit cooling devices. The mounting arrangement of many integrated circuit devices, e.g., a central processing unit of a computer, requires that the integrated circuit device be clamped to the printed circuit board with a certain level of force. To provide this force, clamping mechanisms are generally provided which contact the top of the integrated circuit device and thereby clamp the integrated circuit device to the printed circuit board. The location of such clamping mechanisms often prevents a cooling device from directly contacting the integrated circuit device and, thus, prevents the cooling device from properly cooling the integrated circuit device.

Thus, it would be generally desirable to provide an apparatus which overcomes these problems associated with integrated circuit device electromagnetic containment and cooling.

SUMMARY OF THE INVENTION

The present invention is directed to an enclosure for integrated circuit devices. The enclosure may include a first part which substantially encloses a plurality of relatively low-power secondary integrated circuit devices mounted on a pc board. The enclosure first part may include a mechanism for contacting the secondary integrated circuit devices in order to conduct heat away from the secondary devices and thus cool the devices. The enclosure first part may be provided with cooling fins to facilitate this cooling function.

The enclosure may also include a second part which may include an active cooling device which is directly in contact with a relatively high-power primary integrated circuit device mounted on the pc board. The active cooling device serves to cool the primary integrated circuit device.

The enclosure first part may be configured to allow a first level of controlled force to be applied to the secondary integrated circuit devices. The enclosure second part may be configured to allow a second level of controlled force, independent of the first level of controlled force, to be applied to the primary integrated circuit device. The ability to independently supply force to the primary and secondary devices facilitates mounting of the devices on the pc board and reduces the risk of damage to the devices which might otherwise be caused by the application of excessive force.

The first and second enclosure parts may, together, completely enclose the primary and secondary integrated circuit devices and may be electrically interconnected such that the enclosure also serves to block electromagnetic energy generated by the devices from escaping from the enclosure.

DETAILED DESCRIPTION OF THE INVENTION

Figure 1:
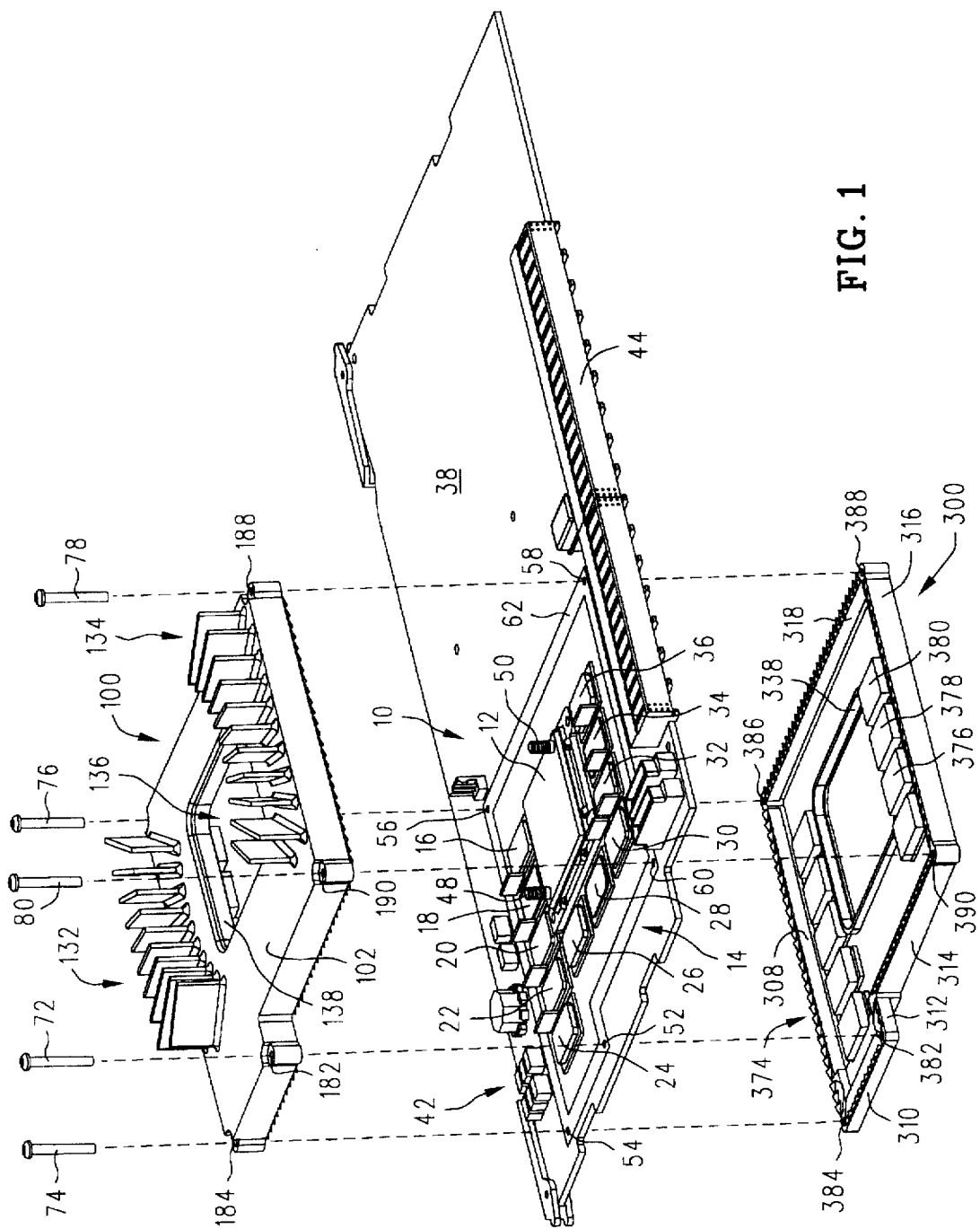
FIG. 1 is a top exploded perspective view showing the attachment of top and bottom enclosure portions to a pc board.

FIGS. 1-14, in general, illustrate an enclosure mounted on a printed circuit board 10 in proximity to at least one primary integrated circuit device 12 and at least one secondary electronic component 14 which are mounted on the printed circuit board 10. The enclosure includes a first enclosure portion 100 including an upper wall member 102 extending substantially parallel to the printed circuit board 10, wherein the upper wall member 102 has a lower surface 106 facing the printed circuit board 10, an upper surface 104 opposite the lower surface 106 and at least one opening 136 therein located proximate the at least one primary integrated circuit device 12; a plurality of leg wall members 108, 110, 112, 114, 116, 118 extending transversely from the upper wall member 102 toward an upper surface 38 of the printed circuit board 10; at least one contact member 142 extending from the upper wall member lower surface 106 toward the printed circuit board upper surface 38, wherein the at least one contact member 142 is in contact with the at least one secondary component 14. The enclosure may also include at least one cooling device 250 having a lower surface 278 in contact with the at least one primary integrated circuit device 12; and wherein the at least one cooling device 250 is located within the at least one first enclosure portion opening 136 and is in electrical contact with the first enclosure portion 100.

FIGS. 1-14 also illustrate, in general, an enclosure mounted on a printed circuit board 10 in proximity to at least one primary integrated circuit device 12 mounted on the printed circuit board 10. The enclosure may include a first enclosure portion 100 in contact with an upper surface 38 of the printed circuit board 10 and including at least one opening 136 therein located proximate the at least one primary integrated circuit device 12; at least one cooling device 250 in contact with the at least one primary integrated circuit device 12; and wherein at least a portion of the at least one cooling device 250 is located within the at least one first enclosure portion opening 136 and is in electrical contact with the first enclosure portion 100.

FIGS. 1-14 also illustrate, in general, a method of enclosing at least one primary integrated circuit device 12 and at least one secondary electronic component 14 which are mounted on a printed circuit board 10. The method may include the steps of providing a first enclosure portion 100 having at least one opening 136 located therein; mounting the first enclosure portion on a first surface 38 of the printed circuit board 10 and contacting the at least one secondary component 14 with the first enclosure portion 100 to apply a first level of force to the at least one secondary component 14; providing at least one cooling device 250; placing at least a part of the at least one cooling device 250 within the at least one first enclosure portion opening 136 and contacting the at least one primary integrated circuit device 12 with the at least a part of the at least one cooling device 250 to apply a second level of force to the at least one primary integrated circuit device 12; and establishing electrical contact between the at least one cooling device 250 and the first enclosure portion 100.

Having thus described the enclosure in general, the device will now be described in further detail.

Figure 2:
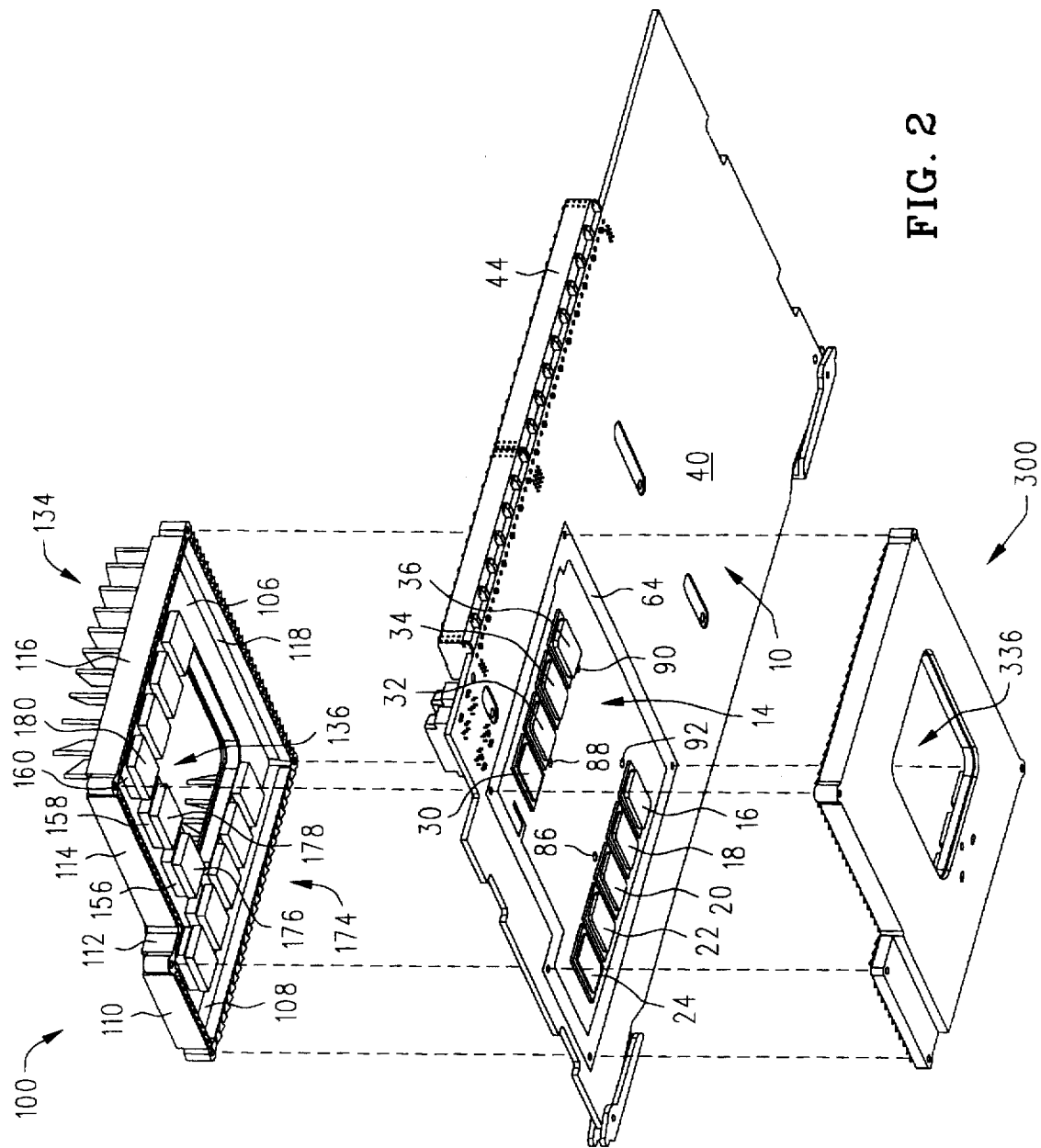
FIG. 2 is a bottom exploded perspective view showing the attachment of FIG. 1.

FIG. 1 illustrates a printed circuit board 10. A primary integrated circuit device 12 may be mounted on an upper surface 38 of the printed circuit bard 10 as shown. Primary integrated circuit device 12 may be a central processing unit for a computer and may, for example, be a central processing unit of the type commercially available from Hewlett-Packard Company and sold as a "PA-7200" processor. Surrounding the primary integrated circuit device 12 are a plurality of secondary integrated circuit devices 14, such as the individual secondary integrated circuit devices 16, 18, 20, 22, 24, 26, 28, 30, 32, 34 and 36. Secondary integrated circuit devices 14 may, for example, be cache SRAM memory devices. Referring to FIG. 2, it can be seen that some of the secondary integrated circuit devices 14, e.g., the secondary devices 16, 18, 20, 22, 24, 30, 32, 34 and 36, may extend completely through the pc board 10 and project from the bottom surface 40 of the pc board 10.

PC board 10 may include other electronic components, schematically illustrated by reference numeral 42 in FIG. 1, and a connection device 44 in a conventional manner. Connection device 44 may be provided to allow the integrated circuit devices located on the pc board 10 to interface with electronic components located elsewhere. In the case of a computer, for example, the connection device 44 may allow the pc board to communicate with such user interface devices as a monitor and a keyboard.

Integrated circuit devices, such as the primary integrated circuit device 12 and the secondary integrated circuit devices 14, inherently emit electromagnetic radiation during operation. This electromagnetic radiation may cause interference with communication devices, such as telephones, radios, and televisions. It is, therefore, desirable to block this radiation to prevent such interference.

In addition, integrated circuit devices, such as the primary integrated circuit device 12 and the secondary integrated circuit devices 14, typically generate significant amounts of heat during operation. In order to prevent damage to and/or reduced efficiency of the integrated circuit devices, it is necessary to remove this heat by cooling the devices during operation. This is particularly true with respect to the primary integrated circuit device because this device tends to draw more power and, thus, generate more heat than do the secondary integrated circuit devices 14.

An enclosure which effectively blocks electromagnetic radiation generated by the primary integrated circuit device 12 and the secondary integrated circuit devices 14 and which provides for adequate cooling of the devices 12 and 14 will now be described in detail.

Referring to FIGS. 1 and 2, it can be seen that the enclosure may generally include an upper enclosure portion 100 which is adapted to contact the upper surface 38 of the pc board 10, FIG. 1, and a lower enclosure portion 300 which is adapted to contact the lower surface 40 of the pc board 10, FIG. 2.

Figure 3:
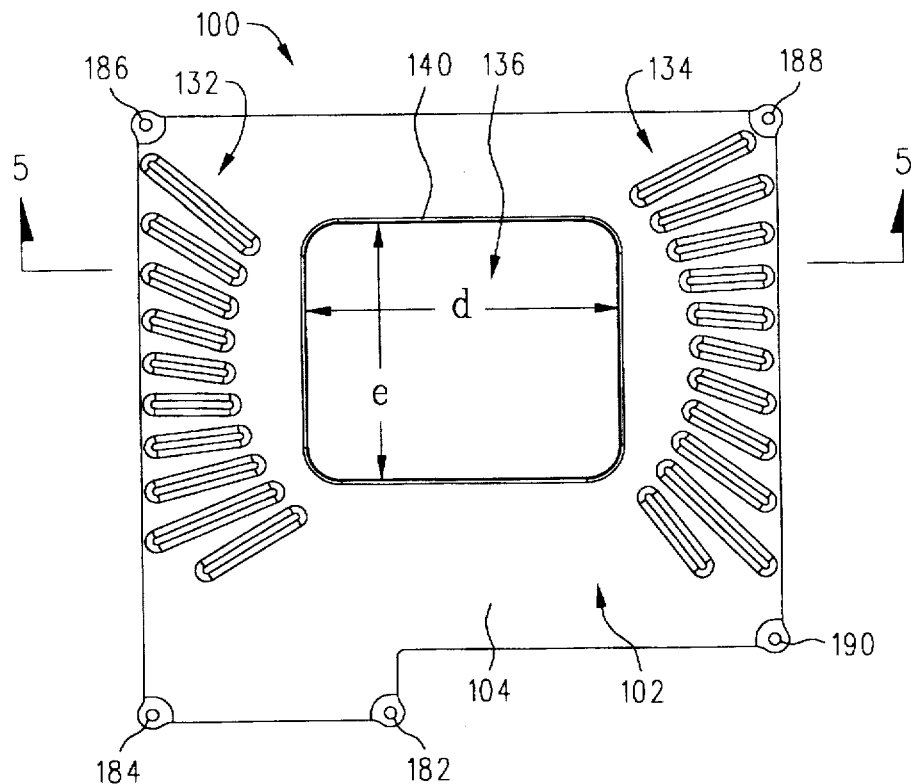
FIG. 3 is a top plan view of an upper enclosure portion.
Figure 4:
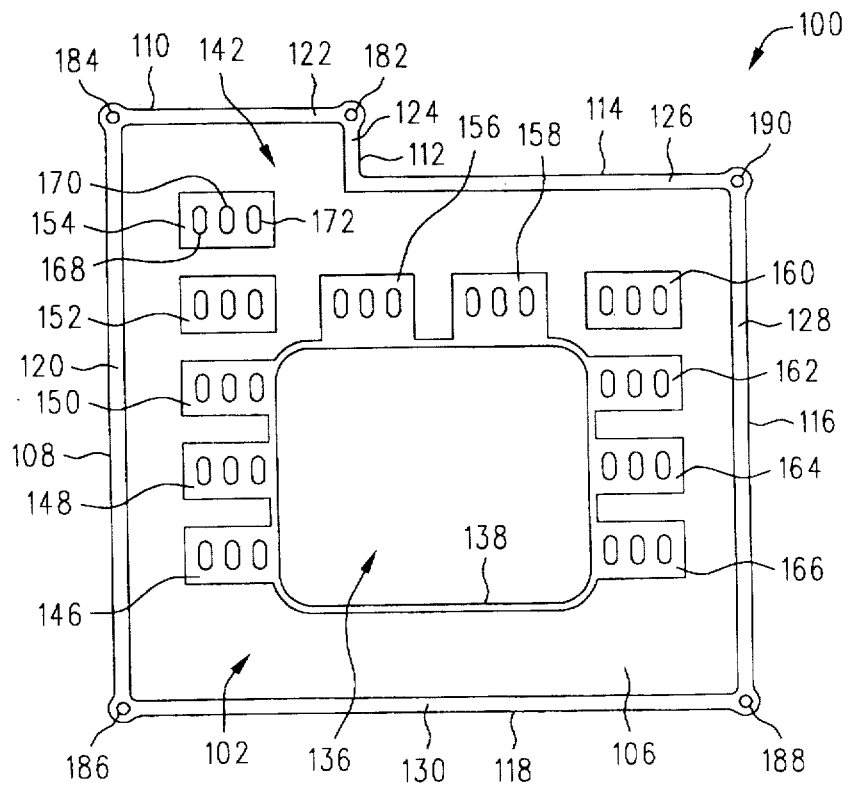
FIG. 4 is a bottom plan view of the upper enclosure portion of FIG. 3.

Upper enclosure portion 100 may be generally formed from a substantially planar top wall member 102 which may include an upper surface 104, FIG. 3 and a lower surface 106, FIG. 4. Extending transversely downwardly from the top wall member 102 are a plurality of side wall members 108, 110, 112, 114, 116 and 118, FIGS. 2 and 4. The side wall members 108, 110, 112, 114, 116 and 118 may be integrally formed with the top wall member 102. Each of the side wall members may include a downwardly facing end portion 120, 122, 124, 126, 128 and 130, respectively. Upper enclosure portion 100 may have an overall height "o" of about 11.2 mm, FIG. 5.

Figure 5:
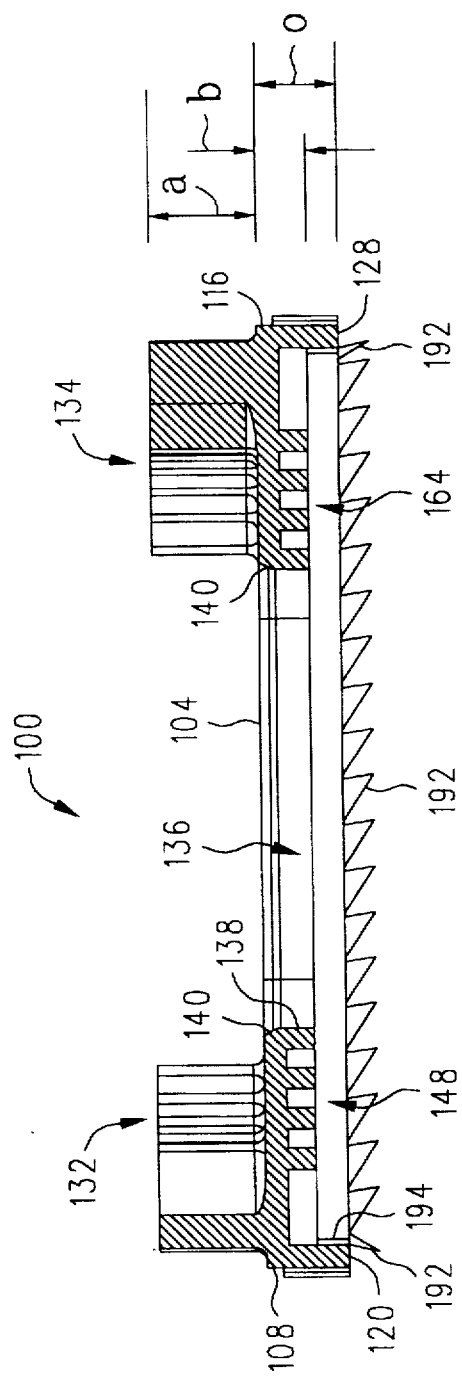
FIG. 5 is a cross-sectional view of the upper enclosure portion taken along the line 5—5 of FIG. 3.

Referring to FIG. 3, a first and second set of cooling fins 132, 134 may extend upwardly from the top wall member upper surface 104. Each of the fins may extend a distance "a" of about 15 mm above the top wall member upper surface 104, FIG. 5. An opening 136 may be provided in the top wall member 102 as shown. Referring to FIGS. 4 and 5, it can be seen that the opening 136 may be surrounded by a flange portion 138. The flange portion 138 may be integrally formed with the top wall member 102 and may extend a distance "b" of about 6.9 mm below the top wall member upper surface 104, FIG. 5. Referring again to FIG. 3, the opening 136 may be substantially rectangular and have a length "d" of about 65.6 mm and a width "e" of about 54.7 mm. A beveled surface 140 may be provided between the top wall member upper surface 104 and the opening flange 138 as shown.

Referring to FIGS. 4 and 5, a plurality of bosses 142 such as the individual bosses 146, 148, 150, 152, 154, 156, 158, 160, 162, 164 and 166 may extend downwardly from the top wall member lower surface 106 as shown. The bosses 142 may be integrally formed with the top wall member 102 and may extend for the distance "b" of about 6.9 mm below the top wall member upper surface 104, FIG. 5. The bosses 142 may be have a generally rectangular cross-section as shown and may be sized and arranged to correspond to the size and arrangement of the secondary integrated circuit devices 14 located on the pc board 10, FIG. 1. Referring to FIG. 4, each boss may be provided with a series of slots, such as the slots 168, 170, 172 in the boss 154.

As shown in FIG. 2, compliant thermal interface pads 174 may be attached to each of the bosses 142 as shown, for example, with respect to the compliant thermal interface pads 176, 178, 180 attached to the bosses 156, 158, 160, respectively. When the upper enclosure portion 100 is mounted on the pc board 10 as shown, for example, in FIG. 7, the interface pads 174 will be compressed between the bosses 142 and the respective secondary integrated circuit devices 14. In this manner, the interface pads 174 assist in conducting heat from the secondary integrated circuit devices through the bosses 142 and into the remainder of the upper enclosure portion 100 as will be explained in more detail herein. Compliant thermal interface pads 174 may each have a thickness of approximately 0.125 inches and may be sized and shaped to correspond generally to the size and shape of the bosses 142. The compliant thermal interface pads 174 may be made of a material commercially available from Bergquist Company of Minneapolis, Minn. and sold as "Gap Pad" thermal interface sheet.

Upper enclosure portion 100 may be provided with a plurality of through-holes 182, 184, 186, 188 and 190 as shown, for example, in FIGS. 3 and 4. These holes may align with a plurality of holes 52, 54, 56, 58 and 60, respectively, located in the pc board 10, FIG. 1, to facilitate mounting of the upper enclosure portion 100 on the pc board 10 as will be explained in further detail herein. Upper enclosure portion 100 may be formed of a material which is both electrically conductive and which readily conducts heat. In this manner, upper enclosure portion 100 may serve to both conduct heat away from the secondary integrated circuit devices 14 and to contain electromagnetic energy generated by the integrated circuit devices 12 and 14 as will be explained in further detail herein. Upper enclosure portion 100 may, for example, be formed of aluminum generally having a thickness of about 3 mm.

Referring to FIG. 5, resilient contact fingers 192 may be extend downwardly from each of the side wall member end portions 120, 122, 124, 126, 128 and 130. The fingers 192 are adapted to contact a metallized ground pad 62 located on the upper surface 38 of the pc board 10, FIG. 1, when the upper enclosure portion 100 is mounted on the pc board 10. This contact between the fingers 192 and the ground pad 62 facilitates electrical contact between the upper enclosure portion 100 and the pc board ground and, thus, enhances the ability of the upper enclosure portion 10 to contain electromagnetic interference generated by the integrated circuit devices 12 and 14, as will be explained in more detail herein. The fingers 192 may be integrally formed with a leg member 194 which may be adhered to the inside surface of the side wall portions 108, 110, 112, 114, 116 and 118 in a conventional manner. The contact fingers 192 may be of the type commercially available from Instrument Specialties Co. of Delaware Water Gap, Pa. and sold as "Sticky Fingers" EMI gasketing material. It is noted that, for purposes of clarity, the contact fingers 192 are not shown in FIG. 4.

Figure 6:
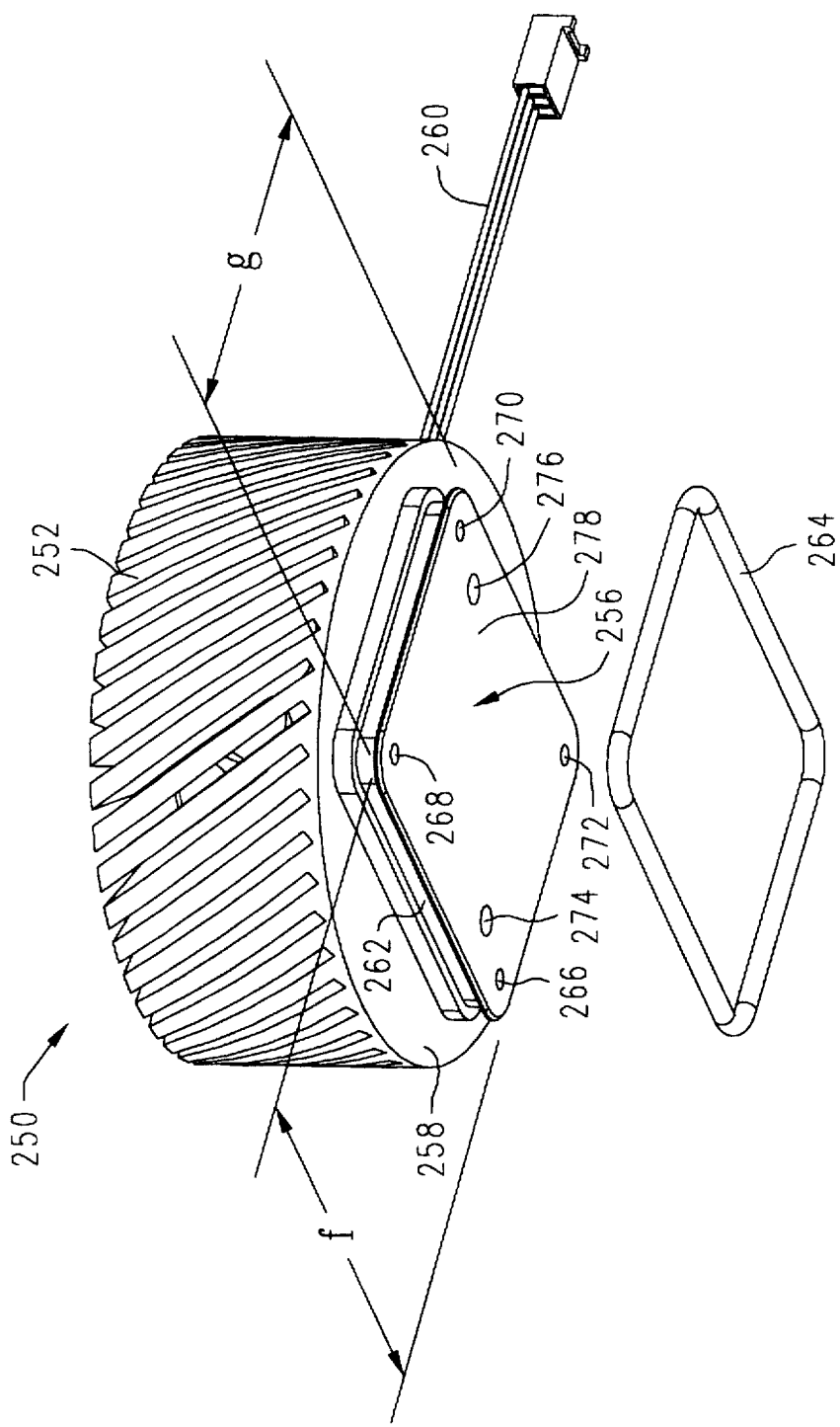
FIG. 6 is a bottom perspective view of a cooling device used in conjunction with the upper enclosure portion of FIG. 3.

Referring to FIG. 6, a cooling device 250 may be provided as shown. Cooling device 250 may generally be constructed having a heat sink portion 252 and a fan 254 located within the heat sink portion 252, FIG. 7. Cooling device 250 may be of the type disclosed in the previously referenced U.S. patent application Ser. No. 08/593,185 or may, alternatively, be any conventional type of cooling device used to remove heat from electronic components. In order to facilitate containment of electromagnetic radiation from the integrated circuit devices 12 and 14, as will be explained in more detail herein, the heat sink portion 252 should be constructed of an electrically conductive material such as aluminum. A power cable 260 may be provided as shown in order to deliver electrical energy to the fan 254 located within the heat sink 252 in a conventional manner.

Referring again to FIG. 6, a pedestal 256 may extend from a lower surface 258 of the cooling device heat sink portion 252. The pedestal 256 may be integrally formed with the heat sink 252 and may be generally rectangular, having a length "f" of about 64.6 mm and a width "g" of about 53.7 mm. The pedestal 256 may extend a distance of about 7 mm below the heat sink lower surface 258 and may include a lower surface 278 as shown.

A groove 262 may be provided around a lower portion of the pedestal 256 as shown. An electrically conductive, compressible O-ring 264 may be provided as shown, and may be sized to fit securely within the groove 262 in a conventional manner. O-ring 264 may be in the form of a metallic spring and may be of the type commercially available from Bal Seal Engineering Company of Santa Ana, Calif. and sold as part no. 105LB. The pedestal 256 may be provided with a plurality of threaded holes 266, 268, 270 and 272 and with a pair of non-threaded holes 274 and 276 as shown.

Figure 7:
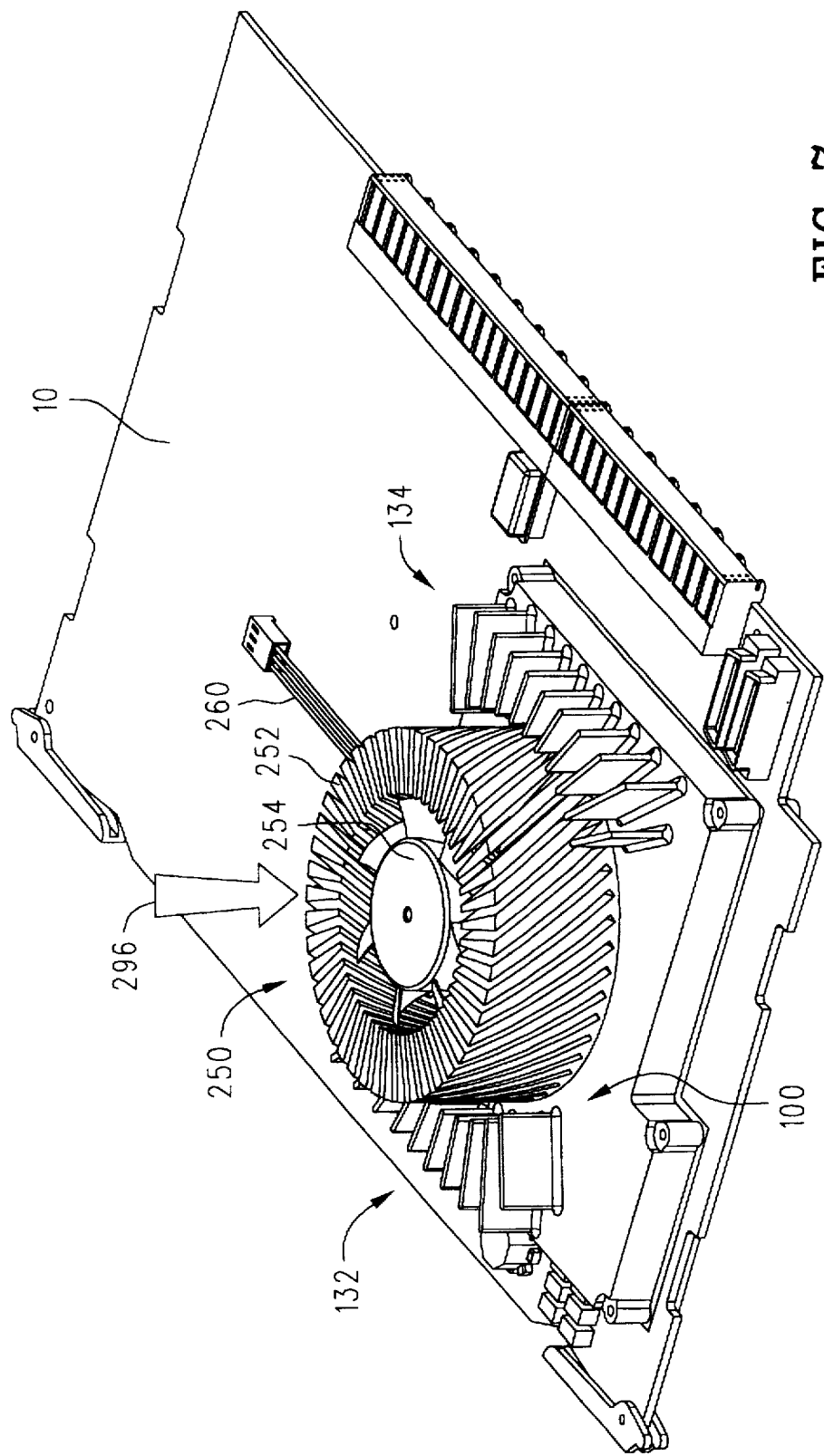
FIG. 7 is a top perspective view of a fully assembled enclosure mounted on a pc board.

When the cooling device 250 is mounted on the upper enclosure portion 100, as shown in FIG. 7, the cooling device pedestal 256 fits within the upper enclosure portion opening 136. When so mounted, the compressible O-ring 264 will be compressed between the pedestal groove 262 and the upper enclosure portion flange 138, FIGS. 1 and 5. The contact between the upper enclosure portion flange 138, the conductive O-ring 264 and the cooling device pedestal groove 262 facilitates electrical contact between the upper enclosure portion 100 and the cooling device 250 and, thus, enhances the ability of the upper enclosure portion 100 and attached cooling device 250 to contain electromagnetic interference generated by the integrated circuit devices 12 and 14, as will be explained in more detail herein. When inserting the cooling device pedestal 256 into the upper enclosure portion opening 136, the beveled surface 140, FIG. 3, facilitates compression of the compressible O-ring 264.

Figure 8:
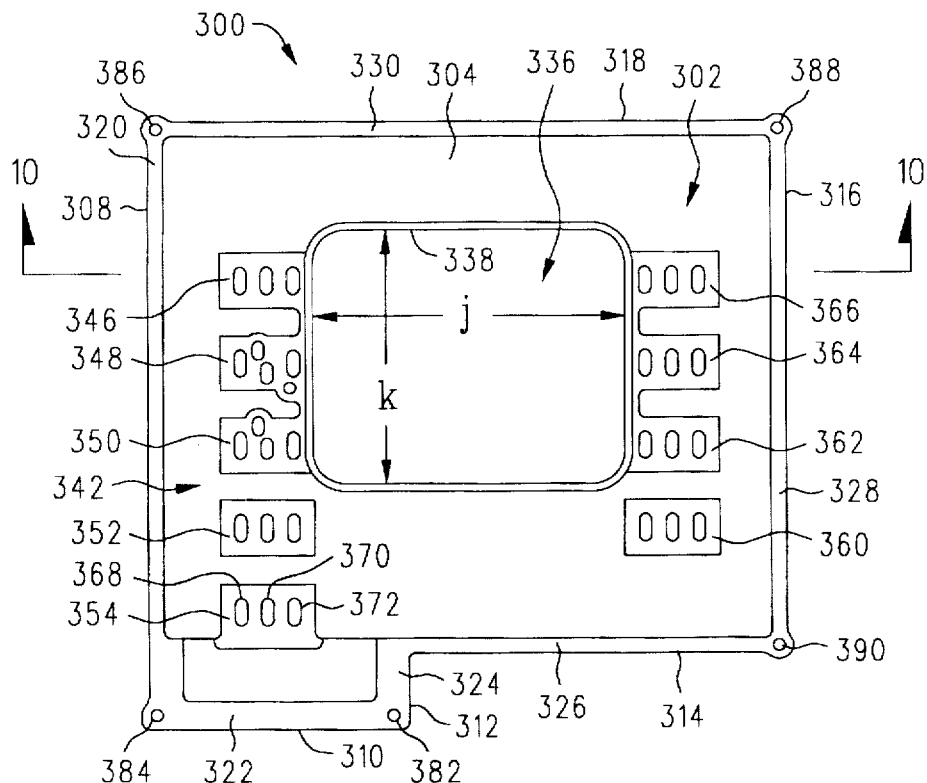
FIG. 8 is top plan view of a lower enclosure portion.
Figure 9:
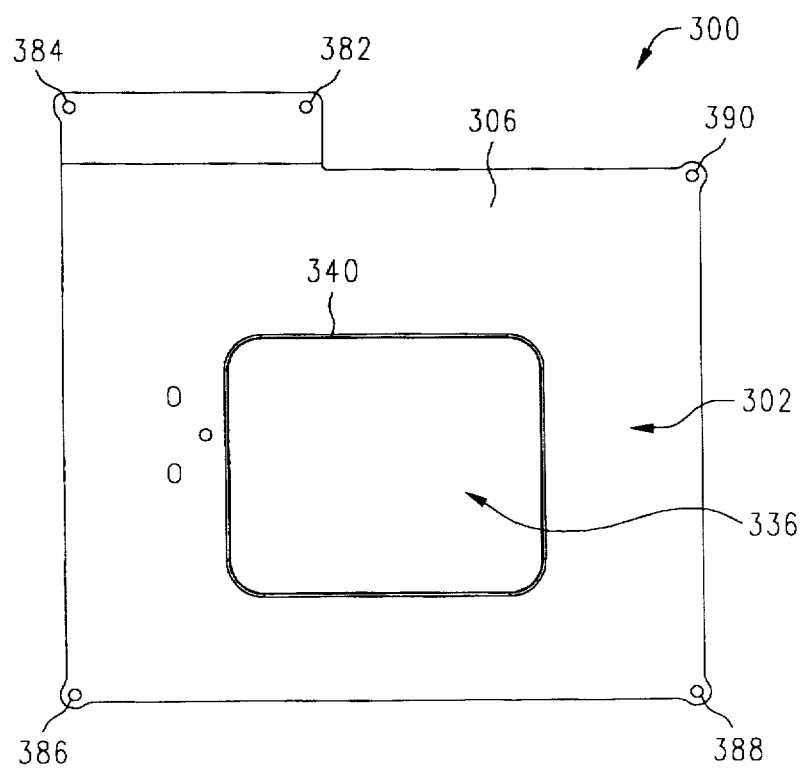
FIG. 9 is a bottom plan view of the lower enclosure portion of FIG. 8.
Figure 10:
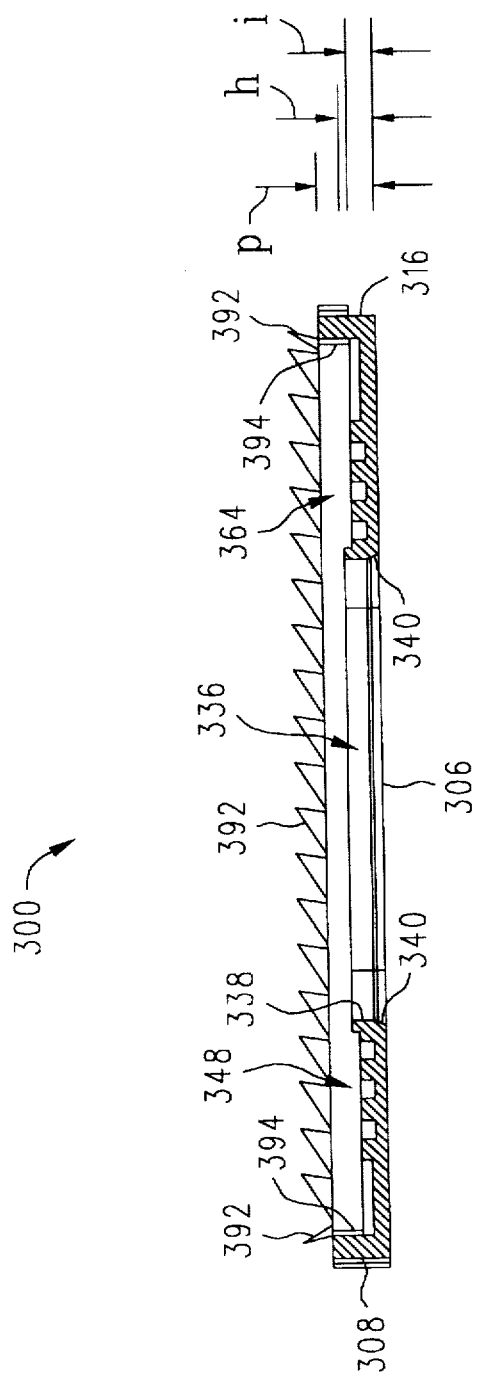
FIG. 10 is a cross-sectional view of the lower enclosure portion taken along the line 10—10 of FIG. 8.

Referring to FIGS. 8–10, lower enclosure portion 300 may be generally formed from a substantially planar bottom wall member 302 which may include an upper surface 304, FIG. 8 and a lower surface 306, FIG. 9. Extending transversely upwardly from the bottom wall member 302 are a plurality of side wall members 308, 310, 312, 314, 316 and 318, FIGS. 1 and 8. The side wall members 308, 310, 312, 314, 316 and 318 may be integrally formed with the bottom wall member 302. Each of the side wall members may include an upwardly facing end portion 320, 322, 324, 326, 328 and 330, respectively. Lower enclosure portion 300 may have an overall height "p" of about 7.9 mm, FIG. 10.

As can be seen from FIGS. 8 and 9, an opening 336 may be provided in the bottom wall member 302 as shown. Referring to FIGS. 1 and 8, it can be seen that the opening 336 may be surrounded by a flange portion 338. The flange portion 338 may be integrally formed with the bottom wall member 302 and may extend a distance "h" of about 3.7 mm above the bottom wall member lower surface 306, FIG. 10. Referring again to FIG. 8, the hole 336 may be substantially rectangular and have a length "j" of about 65.6 mm and a width "k" of about 54.7 mm. A beveled surface 340, FIG. 9, may be provided between the bottom wall member lower surface 306 and the opening flange 338 as shown.

Referring to FIGS. 8 and 10, a plurality of bosses 342 such as the individual bosses 346, 348, 350, 352, 354, 360, 362, 364 and 366 may extend upwardly from the bottom wall member upper surface 304 as shown. The bosses 342 may be integrally formed with the bottom wall member 302 and may extend for a distance "i" of about 3.6 mm above the bottom wall member lower surface 304, FIG. 10. The bosses 342 may be have a generally rectangular cross-section as shown and may be sized and arranged to correspond to the size and arrangement of the secondary integrated circuit devices 14 located on the pc board 10, FIG. 2. It is noted that the number and arrangement of the lower enclosure portion bosses 342 need not be identical to that of the upper enclosure portion 100, as previously described. Comparing FIG. 1 with FIG. 2, it can be seen, for example, that the lower enclosure portion lacks any bosses corresponding in location to the upper enclosure bosses 156 and 158. This is because the secondary integrated circuit devices 26 and 28, which correspond to the upper enclosure portion bosses 156 and 58 respectively, do not extend completely through the pc board 10 and project from the bottom surface 40 of the pc board as do the remainder of the secondary integrated circuit devices 14. Referring again to FIG. 8, each boss 42 may be provided with a series of slots, such as the slots 368, 370, 372 in the boss 354.

As shown in FIG. 1, compliant thermal interface pads 74 may be attached to each of the bosses 342 as shown, for example, with respect to the compliant thermal interface pads 376, 378, 380 attached to the bosses 362, 364, 366, respectively. When the lower enclosure portion 300 is mounted on the pc board 10, the interface pads 374 will be compressed between the bosses 342 and the respective secondary integrated circuit devices 14. In this manner, the interface pads 374 assist in conducting heat from the secondary integrated circuit devices through the bosses 342 and into the remainder of the lower enclosure portion 300 as will be explained in more detail herein. The compliant thermal interface pads 374 may each have a thickness of approximately 0.125 inches and may be sized and shaped to correspond generally to the size and shape of the bosses 342. The compliant thermal interface pads 374 may be identical to the thermal interface pads 174, previously described.

Lower enclosure portion 300 may be provided with a plurality of threaded holes 382, 384, 386, 388 and 390 as shown, for example, in FIGS. 8 and 9. These holes may align with the plurality of holes 52, 54, 56, 58 and 60, respectively, located in the pc board 10, FIG. 1, to facilitate mounting of the lower enclosure portion 300 on the pc board 10 as will be explained in further detail herein. Lower enclosure portion 300 may be formed of a material which is both electrically conductive and which readily conducts heat. In this manner, lower enclosure portion 300 may serve to both conduct heat away from the secondary integrated circuit devices 14 and to contain electromagnetic energy generated by the integrated circuit devices 12 and 14 as will be explained in further detail herein. Lower enclosure portion 300 may, for example, be formed of aluminum generally having a thickness of about 3 mm.

Referring to FIG. 10, resilient contact fingers 392 may be extend upwardly from each of the side wall member end portions 320, 322, 324, 326, 328 and 330. The fingers 392 are adapted to contact a metallized ground pad 64 located on the lower surface 40 of the pc board 10, FIG. 2, when the lower enclosure portion 300 is mounted on the pc board 10.

This contact between the fingers 392 and the ground pad 64 facilitates electrical contact between the lower enclosure portion 300 and the pc board ground and, thus, enhances the ability of the lower enclosure portion 300 to contain electromagnetic interference generated by the integrated circuit devices 14 and 16, as will be explained in more detail herein. The fingers 392 may be integrally formed with a leg member 394 which may be adhered to the inside surface of the side wall portions 108, 110, 112, 114, 116 and 118 in a conventional manner. The contact fingers 392 may be identical to the contact fingers 192, previously described with respect to the upper enclosure portion 100. It is noted that, for purposes of clarity, the contact fingers 392 are not shown in FIG. 8.

Figure 11:
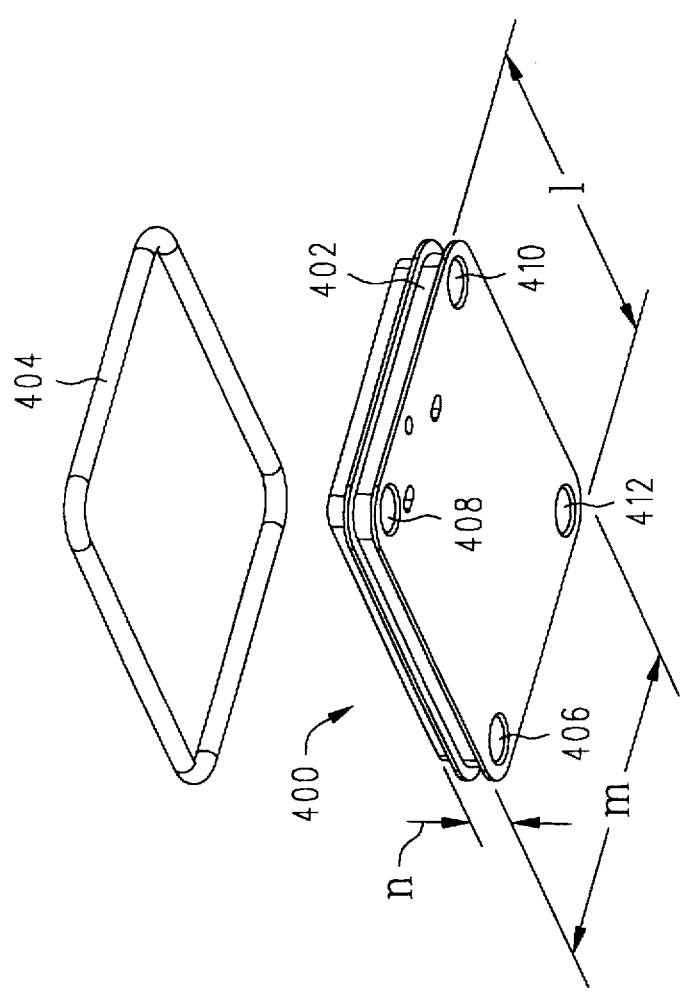
FIG. 11 is a bottom perspective view of a bolster plate used in conjunction with the lower enclosure portion of FIG. 8.

Referring to FIG. 11, a bolster plate 400 may be provided as shown. Bolster plate 400 may be generally rectangular, having a length "l" of about 64.6 mm and a width "m" of about 53.7 mm. Bolster plate 400 may have an overall height "n" of about 8 mm. In order to facilitate containment of electromagnetic radiation from the integrated circuit devices 12 and 14, as will be explained in more detail herein, the bolster plate 400 should be constructed of an electrically conductive material such as aluminum.

A groove 402 may be provided around a lower portion of the bolster plate 400. An electrically conductive, compressible O-ring 404 may be provided as shown, and may be sized to fit securely within the groove 402 in a conventional manner. O-ring 404 may be in the form of a metallic spring and may be identical to the O-ring 264 previously described. Bolster plate 400 may be provided with a plurality of non-threaded through holes 406, 408, 410 and 412 as shown.

Figure 12:
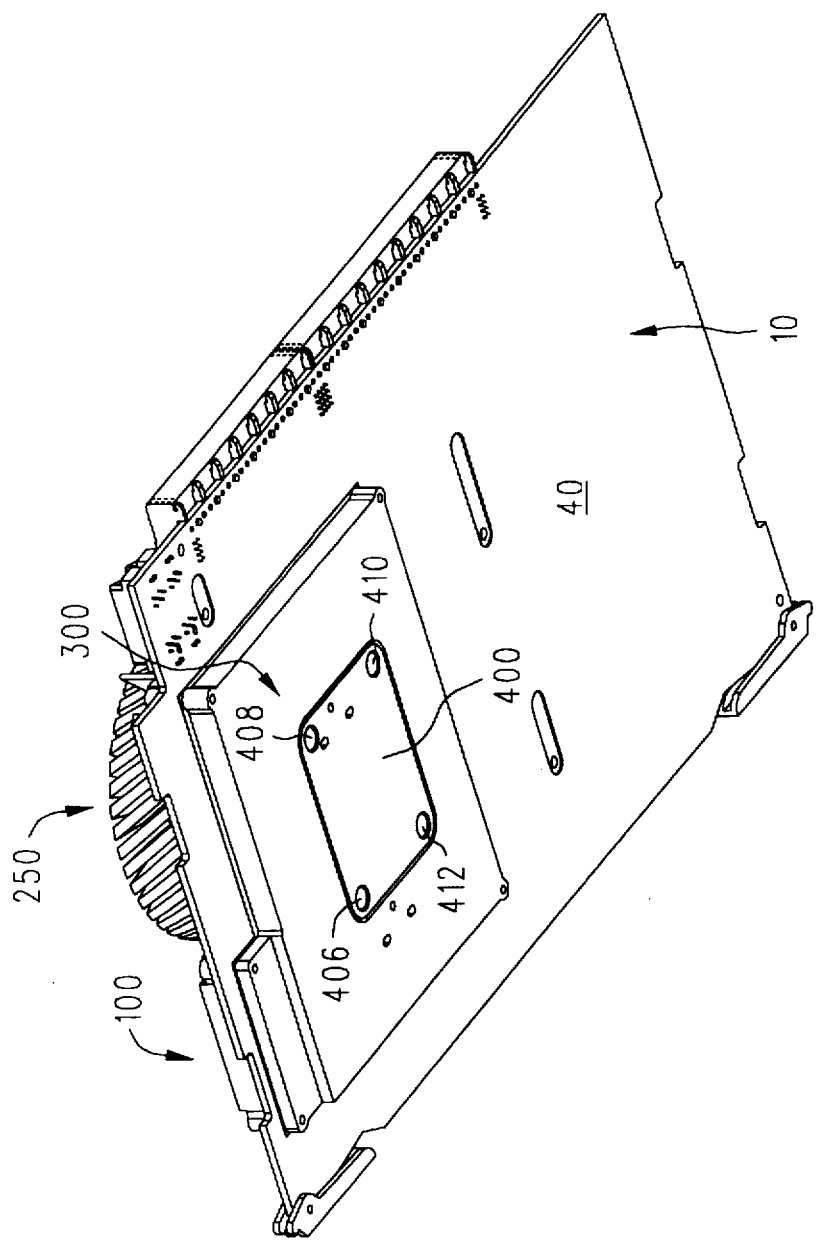
FIG. 12 is a bottom perspective view of a fully assembled enclosure mounted on a pc board.

When the bolster plate 400 is mounted on the lower enclosure portion 300, as shown in FIG. 12, the bolster plate fits within the lower enclosure portion opening 336. When so mounted, the compressible O-ring 404 will be compressed between the bolster plate groove 402 and the lower enclosure portion flange 338, FIGS. 8 and 10. The contact between the lower enclosure portion flange 338, the conductive O-ring 404 and the bolster plate groove 402 facilitates electrical contact between the lower enclosure portion 300 and the bolster plate 400 and, thus, enhances the ability of the lower enclosure portion 300 and attached bolster plate 400 to contain electromagnetic energy generated by the integrated circuit devices 14 and 16, as will be explained in more detail herein. When inserting the bolster plate 400 into the lower enclosure portion opening 336, the beveled surface 340, FIG. 9, facilitates compression of the compressible O-ring 404.

The installation of the upper and lower enclosure portions 100, 300 on the pc board 10 will now be described in detail. Referring to FIG. 1, a plurality of screws 72, 74, 76, 78 and 80 may be passed through the holes 182, 184, 186, 188 and 190, respectively, in the upper enclosure portion 100, through the holes 52, 54, 56, 58 and 60, respectively, in pc board 10 and may engage within the threaded holes 382, 384, 386, 388 and 390, respectively, in the lower enclosure portion 300. As can be appreciated, tightening the screws 72, 74, 76, 78 and 80 within the threaded holes 382, 384, 386, 388 and 390, respectively, in the lower enclosure portion 300 will cause the upper enclosure portion 100 to be securely clamped against the pc board upper surface 38 and the lower enclosure portion 300 to be securely clamped against the pc board lower surface 40.

When the upper enclosure 100 is installed on the pc board 10, as described above, the compliant thermal interface pads 174 located on the upper enclosure bosses 142, FIG. 2, will be compressed against the upper surfaces of the respective secondary integrated circuit devices 14. Such compression ensures reliable surface contact between the thermal interface pads and the upper enclosure bosses 142 and between the thermal interface pads and the upper surfaces of the secondary integrated circuit devices 14.

This surface contact facilitates the efficient conduction of heat away from the secondary components 14, through the interface pads and into the upper enclosure bosses 142. From the bosses, the heat is further conducted into the upper enclosure portion top wall member 102 and then into the cooling fins 132, 134 for subsequent dissipation into the surrounding air. Further facilitating the efficient conduction of heat is the fact that the upper enclosure portion 100 is integrally formed, i.e., the bosses 142, the top wall member 102 and the cooling fins 132, 134 are formed from one piece of heat conductive material, e.g., aluminum. This one-piece construction minimizes the number of joints within the heat flow path and, thus, maximizes heat conductance.

As described adore, it is desirable to provide some compression of the thermal interface pads 174 in order to facilitate heat removal from the secondary integrated circuit devices 14. It is also critical, however, to ensure that too much force is not applied to the secondary integrated circuit devices. Integrated circuit devices such as the secondary integrated circuit devices 14 are generally each attached to a pc board via a series of solder joints. Excessive force applied to such integrated circuit devices may, over time, damage these solder joints and impair the proper operation of the devices. It has been found, for example, that maintaining the compressive force on each secondary integrated circuit device at 5 lbs. or less is generally sufficient to ensure that the damage previously described does not occur and that the long-term reliability of the devices is not jeopardized.

Once the upper enclosure portion 100 is seated against the pc board 10, i.e., when the resilient contact fingers 192 are completely compressed against the pc board upper surface ground pad 62, further tightening of the screws 72, 74, 76, 78 and 80 will have no effect on the amount of force supplied to the secondary integrated circuit devices 14. The amount of force supplied to the secondary integrated circuit devices 14 by the upper enclosure portion 100 is determined solely by the relationship between the height of the integrated circuit device extending above the pc board 10, the thickness and composition of the thermal interface pads used, and the height "c" of the bosses 142 relative to the overall height "o" of the upper enclosure portion 100, FIG. 5. It has been found that with an integrated circuit device having a height of about 0.1 inches, the exemplary dimensions previously set forth and the thermal interface pad material previously specified result in a force of less than 5 lbs. being applied to each secondary integrated circuit device and yet also result in adequate surface contact between the thermal interface pads 174 and the upper enclosure bosses 142 and between the thermal interface pads 174 and the upper surfaces of the secondary integrated circuit devices 14. It is to be understood, of course, that other dimensional relationships could easily be used to accommodate integrated circuit devices of varying size.

Adequate surface contact between the thermal interface pads 174 and the upper enclosure bosses 142 and between the thermal interface pads and the upper surfaces of the secondary integrated circuit devices 14 is enhanced by the upper enclosure portion 100 in two additional ways. First, the slots in the bosses 142, such as the slots 168, 170, 172, FIG. 3, allow the thermal interface pad material to deform thereinto, thereby allowing the pads to deform rather than transmit a high level of force to the secondary integrated circuit devices 14. Second, the upper enclosure portion 100 is provided with a plurality of separate bosses, rather than one large boss. Because separate bosses are provided, each thermal interface pad may deform laterally in four directions, thus further allowing the pads to deform rather than to transmit a high level of force to the secondary integrated circuit devices 14. Both the slots and the separate boss arrangement allow the thermal interface pads to be compressed, thereby ensuring good surface contact with the boss and with the integrated circuit device, and yet not transmit high levels of force to the integrated circuit devices.

When the lower enclosure 300 is installed on the pc board 10, as described above, the compliant thermal interface pads 374 located on the lower enclosure bosses 342, FIG. 2, will be compressed against the lower surfaces of the respective secondary integrated circuit devices 14. Such compression ensures reliable surface contact between the thermal interface pads and the lower enclosure bosses 342 and between the thermal interface pads and the lower surfaces of the secondary integrated circuit devices This surface contact facilitates the efficient conduction of heat away from the secondary components 14, through the interface pads 374 and into the lower enclosure bosses 342. From the bosses, the heat is further conducted into the lower enclosure portion bottom wall member 302 for subsequent dissipation into the surrounding air and/or into the material making up a computer case structure with which the lower enclosure portion bottom wall member 302 may be in contact. Further facilitating the efficient conduction of heat is the fact that the lower enclosure portion 300 is integrally formed, i.e., the bosses 342 and the bottom wall member 302 are formed from one piece of heat conductive material, e.g., aluminum. This one-piece construction minimizes the number of joints within the heat flow path and, thus, maximizes heat conductance.

As in the case of the upper enclosure portion 100, as previously described, once the lower enclosure portion 300 is seated against the pc board 10, i.e., when the resilient contact fingers 392 are completely compressed against the pc board lower surface ground pad 64, further tightening of the screws 72, 74, 76, 78 and 80 will have no effect on the amount of force supplied to the secondary integrated circuit devices 14. The amount of force supplied to the secondary integrated circuit devices 14 is determined solely by the relationship between the height of the integrated circuit device extending below the pc board, the thickness and composition of the thermal interface pads used, and the height "i" of the bosses 342 relative to the overall height "p" of the lower enclosure portion 300, FIG. 10. It has been found that, with an integrated circuit device having a height of about 0.1 inches, the exemplary dimensions previously set forth and the thermal interface pad material previously specified result in a force of less than 5 lbs. being applied to each secondary integrated circuit device by the lower enclosure portion 300 and yet also result in adequate surface contact between the thermal interface pads 374 and the lower enclosure bosses 342 and between the thermal interface pads 374 and the lower surfaces of the secondary integrated circuit devices 14. It is to be understood, of course, that other dimensional relationships could easily be used to accommodate integrated circuit devices of varying size.

In a similar manner to the upper enclosure portion 100, adequate surface contact between the thermal interface pads 374 and the lower enclosure bosses 342 and between the thermal interface pads 374 and the lower surfaces of the secondary integrated circuit devices 14 is enhanced by the design of the lower enclosure portion 100 in two ways. First, the slots in the bosses 342, such as the slots 368, 370, 372, FIG. 8, allow the thermal interface pad material to deform thereinto, thereby allowing the pads to deform rather than transmit a high level of force to the secondary integrated circuit devices 14. Second, the lower enclosure portion 300 is provided with a plurality of separate bosses, rather than one large boss. Because separate bosses are provided, each thermal interface pad may deform laterally in four directions, thus further allowing the pads to deform rather than to transmit a high level of force to the secondary integrated circuit devices 14. Both the slots and the separate boss arrangement allow the thermal interface pads to be compressed, thereby ensuring good surface contact with the boss and with the integrated circuit device, and yet not transmit high levels of force to the integrated circuit devices.

After installation of the upper and lower enclosure portions 100, 300, the cooling device 250 and bolster plate 400 may be installed as follows. First, if not already installed, the primary integrated circuit device 12 may be installed on the pc board 10 as shown in FIG. 1. The cooling device pedestal 256, with its O-ring 264 mounted in the groove 262, may then be inserted into the upper enclosure opening 136 until the pedestal lower surface 278 contacts the upper surface of the primary integrated circuit device 12. The bolster plate 400, with its O-ring 404 mounted in the groove 402 then may be inserted into the lower enclosure opening 336 until the bolster plate contacts the lower surface 40 of the pc board 10. The non-threaded holes 274, 276 in the cooling device pedestal 256 may be provided to allow clearance for a pair of threaded studs 48, 50, FIG. 1, which sometimes exist on primary integrated circuit devices.

Figure 13:
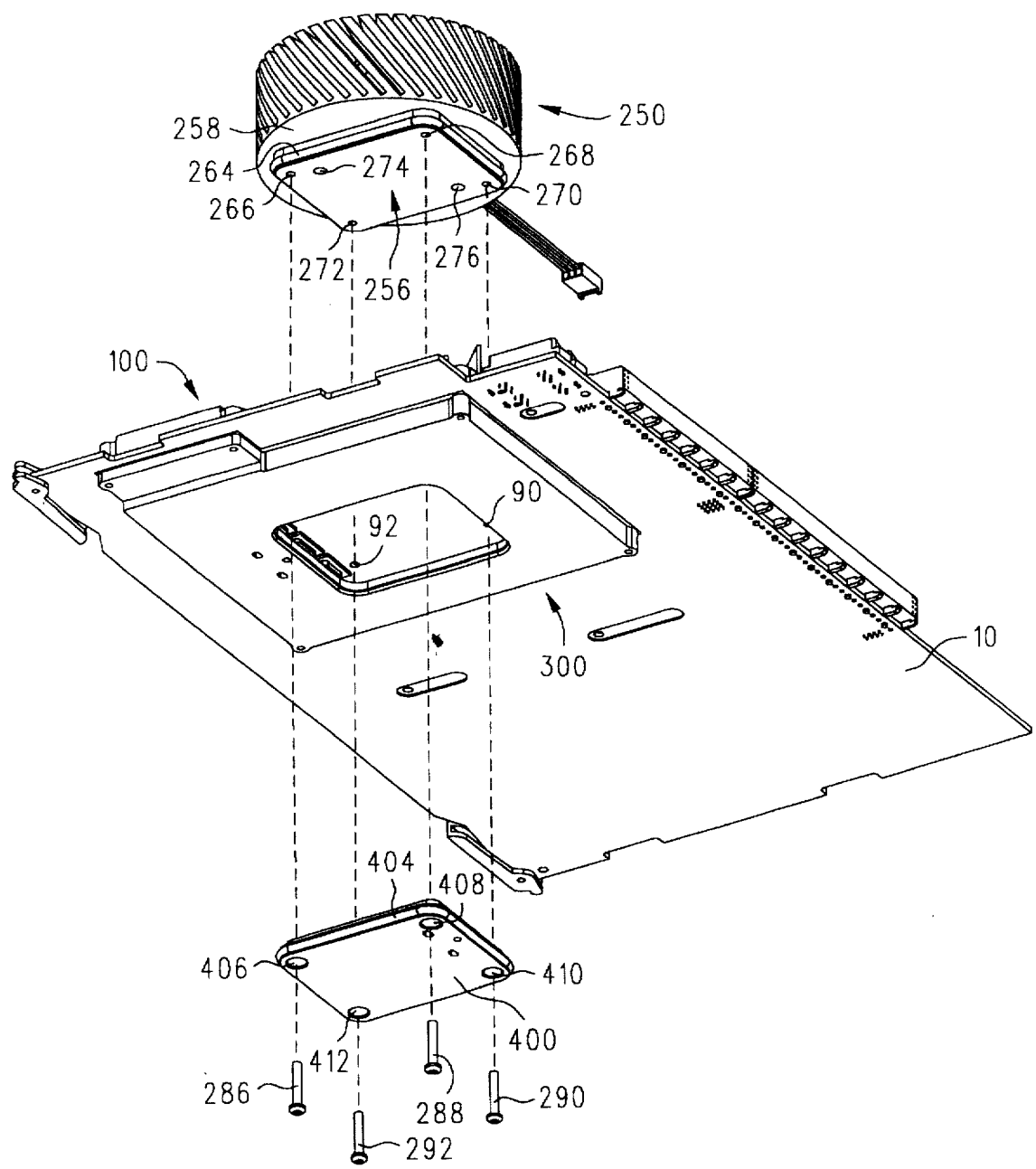
FIG. 13 is a bottom exploded perspective view showing the attachment of the cooling device of FIG. 6 to the upper enclosure portion of FIG. 3 and the attachment of the bolster plate of FIG. 11 to the lower enclosure portion of FIG. 8.

Then, referring to FIG. 13, a plurality of screws 286, 288, 290, 292 may be passed through the holes 406, 408, 410, and 412, respectively, in the bolster plate 400, through a plurality of holes 86, 88, 90 and 92, FIG. 2, respectively, in the pc board 10 and may engage within the threaded holes 266, 268, 270 and 272, respectively, in the cooling device 250. As can be appreciated, tightening the screws 286, 288, 290, 292 within the threaded holes 266, 268, 270 and 272 in the cooling device 250 will cause the bolster plate 400 to be securely clamped against the pc board lower surface 40 and the cooling device pedestal lower surface 278 to be securely clamped against the upper surface of the primary integrated circuit device 12.

Because the primary integrated circuit device 12 generates a significant amount of heat (generally much more than the secondary integrated circuit devices 14), the cooling device 250 is designed to directly contact the upper surface of the primary device 12. In this manner, heat generated by the primary integrated circuit device 12 may be directly conducted into the cooling device pedestal 256 and thereafter into the remainder of the heat sink for dissipation into the surrounding air. The cooling device fan 254 facilitates this heat transfer into the surrounding air in a conventional manner by moving air into the heat sink 252 in the direction of the arrow 296, FIG. 7, and then exhausting the air through the bottom of the fins of the heat sink 252. After exiting the heat sink 252, the air is forced to travel between the fins 132 and 134 of the upper enclosure portion 100, thus facilitating heat removal from the secondary integrated circuit devices 14 as well.

Facilitating the efficient conduction of heat away from the primary integrated circuit device 12 is the fact that the cooling device 250 is integrally formed, i.e., the pedestal 256 and the remainder of the heat sink 252 are formed from one piece of heat conductive material, aluminum. This one-piece construction minimizes the number of joints within the heat flow path and, thus, maximizes heat conductance.

Bolster plate 400 also serves to conduct heat away from the primary integrated circuit device 12 by contacting the lower surface 40 of the pc board 10 directly beneath the primary device 12. In this manner, the bolster plate 400 may conduct heat, which has been conducted through the pc board 10, away from the primary device 12 for subsequent dissipation into the surrounding air and/or into the material making up a computer case structure with which the bolster plate 400 may be in contact.

The cooling device mounting arrangement described above may serve a purpose in addition to heat removal as will now be explained in detail. Many primary integrated circuit devices, such as primary device 12, are attached to a pc board mounting site through the use of compressive force. It is common, for example, to provide a compressible socket between the integrated circuit device and the pc board mounting site. A compressive force on the integrated circuit device is then required to compress the compressible socket and maintain electrical contact between the pc board site and the integrated circuit device. The compressive force required may be quite high and, in some situations, may be as much as 600 lbs.

The cooling device mounting arrangement, as described above, provides a mechanism for clamping the primary integrated circuit device 12 to the pc board and, accordingly, for compressing a compressible socket device between the primary integrated circuit device 12 and the pc board 10. Specifically, the screws 286, 288, 290 and 92, FIG. 13, may be tightened in order to urge the cooling device 250 toward the pc board 10 and, by virtue of the contact between the cooling device pedestal lower surface 278 and the primary device 12, also urge the primary device 12 toward the pc board 10. It is important to note that this force may be exerted independently of the force applied to the secondary integrated circuit devices 14 by the upper and lower enclosure portions 100, 300. As previously described, excessive force supplied to the secondary integrated circuit devices may cause damage to the secondary devices. The present design, thus, allows relatively high force to be applied to the centrally located primary integrated circuit device 12 while relatively low force is applied to the outlying secondary integrated circuit devices 14.

It is noted that, in some cases, rather than using a compressible socket arrangement, primary integrated circuit devices are soldered directly to the pc board 10. In contrast to the compressible socket mounting arrangement previously described, solder mounting arrangements require that little or no force be applied to the primary integrated circuit device 12 since applied force may damage the solder joints between the device and the pc board. In such a situation, the cooling device 250 may be directly mounted to the primary integrated circuit device 12, for example, by the use of the threaded studs 48, 50, FIG. 1. To accomplish such a mounting, threaded nuts, not shown, may be provided on the ends of the studs 48, 50 which project into the interior of the cooling device heat sink 252. In this manner, the cooling device 250 may be securely mounted to the upper surface of the primary device 12 and may serve to cool the device as previously described. The screws 286, 288, 290 and 292 may then be tightened only to the extent necessary to secure the bolster plate 400 in place. As can be appreciated, this mounting arrangement allows less force to be applied to the primary integrated circuit device by the cooling device 250 and bolster plate 400 than is applied to the secondary integrated circuit devices 14 by the upper and lower enclosure portions 100, 300.

Once the upper and lower enclosure portions 100, 300, the cooling device 250 and the bolster plate 400 have been installed, as described previously, the primary and secondary integrated circuit devices 12, 14 will be completely shielded to prevent the emission of electromagnetic energy. Specifically, the upper enclosure portion 100 is in electrical contact with the pc board ground pad 62 via the compressible fingers 192. The upper enclosure portion 100 is also in electrical contact with the cooling device 250 via the conductive O-ring 264. Lower enclosure portion 300 is in electrical contact with the pc board ground pad 64 via the compressible fingers 392. Lower enclosure portion 300 is also in electrical contact with the bolster plate 400 via the conductive O-ring 404. Accordingly, as can be appreciated, the primary and secondary integrated circuit devices 12, 14 are completely enclosed within a conductive enclosure and electromagnetic energy generated by the devices 12, 14 is, thus, effectively contained within the enclosure. In order to enhance the electrical continuity between the various components of the enclosure, the components, i.e., the upper and lower enclosures 100, 300, the cooling device 250 and the bolster plate 400 may be plated, for example, with a nickel plating material in a conventional manner.

In summary, the enclosure described herein provides excellent containment of electromagnetic energy generated by the primary and secondary integrated circuit devices contained therein. The enclosure also provides for efficient heat removal from both the primary and secondary devices and allows separate levels of force to be applied to the primary and secondary devices.

It is to be understood, that, although the pc board 10 has been described herein as having a particular configuration, the enclosure described herein may be adapted to be used with virtually any pc board configuration. Accordingly, the size, shape and configuration of the enclosure may vary according to the particular configuration of the pc board in question.

Figure 14:
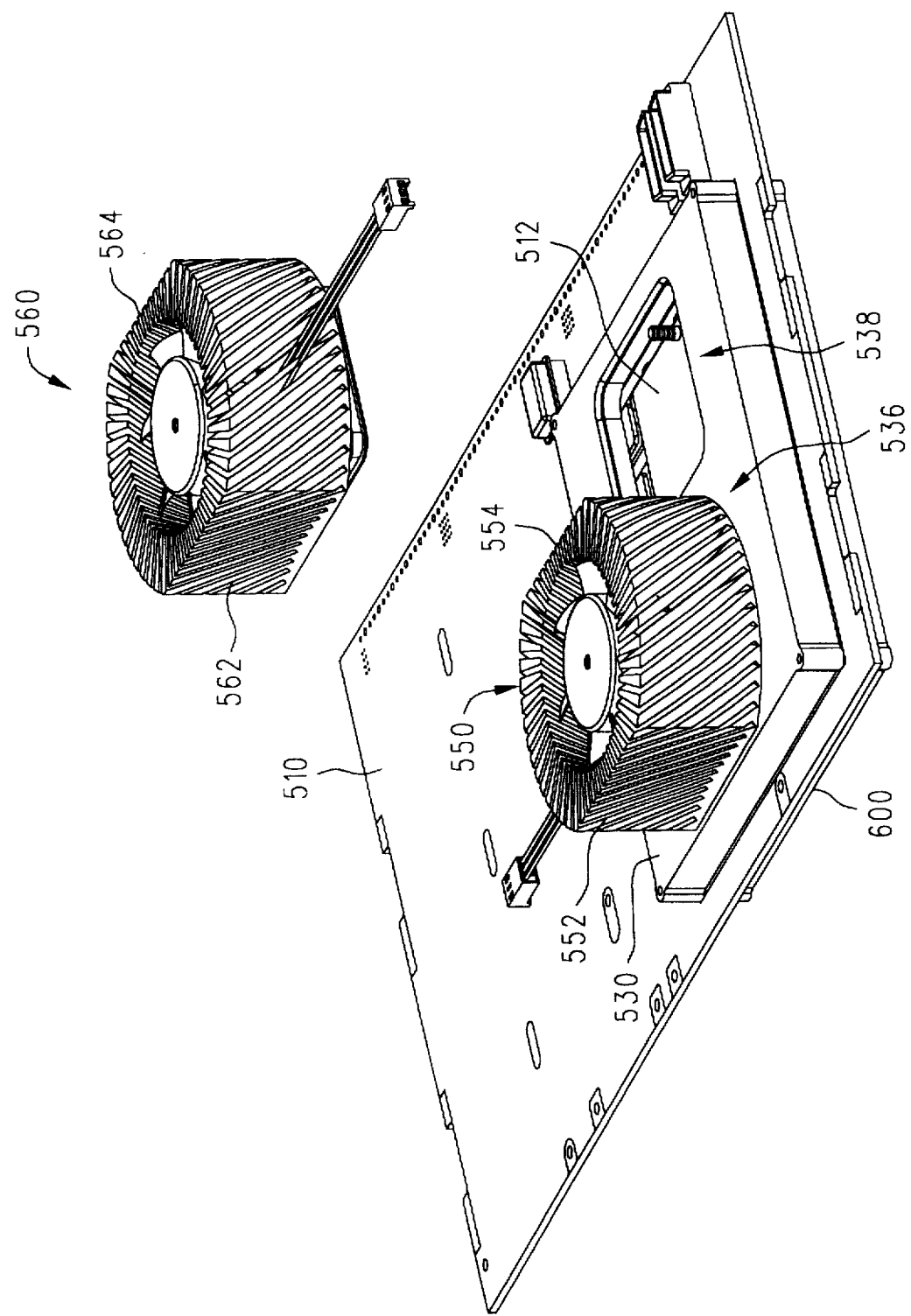
FIG. 14 is a top perspective view of an enclosure having two cooling devices mounted thereon.

In some applications, more than one primary electronic component may be provided on a pc board. In some computer applications, for example, it may be desirable to provide two or more central processing units in order to increase the data handling capability of the computer. FIG. 14 illustrates a pc board 510 upon which are mounted two primary electronic components 512 (only one is shown). In all other respects, the pc board 512 may be identical to the pc board 10, previously described, and may contain a plurality of secondary electronic components generally surrounding the primary components 512, similar to the secondary components 14 of the pc board 10, as previously described.

In order to enclose and cool the primary and secondary electronic components of the pc board 510, an upper enclosure portion 530 may be provided as shown. Upper enclosure portion 530 may include a pair of openings 536, 538. When the upper enclosure portion 530 is mounted on the pc board 510, the openings 536, 538 are each located proximate one of the primary electronic components 512. Each opening 536, 538 may be substantially identical to the opening 136 of the upper enclosure portion 100 previously described. In all other respects, the upper enclosure portion 530 may be substantially identical to the upper enclosure portion 100. The upper enclosure portion 530 may, for example, include a plurality of bosses, not shown, similar to the bosses 142, previously described with respect to the upper enclosure portion 100. The bosses of the upper enclosure portion 530 allow the upper enclosure portion 530 to both cool and apply the appropriate level of force to the secondary electronic components located on the pc board 510 in a similar manner to the bosses 142 of the upper enclosure 100 as previously described.

A pair of cooling devices 550, 560 may also be provided as shown in FIG. 14. Each cooling device 550, 560 may be substantially identical to the cooling device 250 previously described except that a pair of flattened areas 552, 554 may be provided on the cooling device 550 and a pair of flattened areas 562, 564 may be provided on the cooling device 560 as shown. These flattened areas may be provided in order to provide clearance and allow two cooling devices, rather than one cooling device, to be mounted on the upper enclosure portion 530. When mounted on the upper enclosure portion 530, the cooling devices 550, 560 each contact an upper surface of one of the primary electronic components 512 in a similar manner to that previously described with respect to the cooling device 250 and the primary component 12.

A lower enclosure portion 600 may be provided on the lower surface of the pc board 510 as shown. The lower enclosure portion 600 may include a pair of openings, not shown, which may each be substantially identical to the opening 336 in the lower enclosure portion 300. The lower enclosure portion 600, in general, may be formed in a substantially identical manner to the lower enclosure portion 300 as previously described. The lower enclosure portion 600 may, for example, include a plurality of bosses, not shown, similar to the bosses 342, previously described with respect to the lower enclosure portion 300. The bosses of the upper enclosure portion 600 allow the lower enclosure portion 600 to both cool and apply the appropriate level of force to the secondary electronic components located on the pc board 510 in a similar manner to the bosses 342 of the lower enclosure 300 as previously described.

A pair of bolster plates, not shown, may fit within the openings in the lower enclosure portion 600. The bolster plates may be substantially identical to the bolster plate 400 previously described. The pair of bolster plates may be connected, e.g., by screws or bolts to the pair of cooling devices 550, 560 in an identical fashion to that previously described with respect to the bolster plate 400 and cooling device 250. In this manner, the cooling devices 550, 560 are able to cool and apply the appropriate level of force to the primary electronic components 512 in a similar manner to that previously described with respect to the cooling device 250 and the primary component 12.

Other than the differences detailed above, the enclosure of FIG. 14 may be constructed and assembled in an identical fashion to the enclosure of FIGS. 1–13 as previously described. As can be appreciated from the foregoing description, the enclosure of FIG. 14 provides containment of electromagnetic energy generated by and for cooling of two primary and a plurality of secondary integrated circuit devices. It is to be understood, of course, that the enclosure described could also be adapted to contain and cool a greater number than two primary electronic components.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

What is claimed is:

1. An enclosure mounted on a printed circuit board in proximity to at least one primary electronic component and at least one secondary electronic component which are mounted on said printed circuit board, said enclosure comprising:
 a first enclosure portion including
  a. an upper wall member extending substantially parallel to said printed circuit board, wherein said upper wall member has a lower surface facing said printed circuit board, an upper surface opposite said lower surface and at least one opening therein located proximate said at least one primary component;
  b. a plurality of leg wall members extending transversely from said upper wall member toward an upper surface of said printed circuit board;
  c. at least one contact member extending from said upper wall member lower surface toward said printed circuit board upper surface, wherein said at least one contact member is in contact with said at least one secondary component;
 at least one second enclosure portion having a lower surface in contact with said at least one primary component;
 wherein said at least one second enclosure portion is located within said at least one first enclosure portion opening and is in electrical contact with said first enclosure portion.

2. The enclosure of claim 1 wherein said at least one contact member comprises a first contact member portion which is integral with said upper wall member and a second contact member portion which is attached to said first contact member portion such that said second contact member portion is intermediate said first contact member portion and said at least one secondary component.

3. The enclosure of claim 2 wherein said second contact portion is in contact with said at least one secondary component.

4. The enclosure of claim 2 wherein said second contact portion comprises a thermal interface pad.

5. The enclosure of claim 1 wherein said plurality of leg wall members are in contact with a metallized ground pad located on said printed circuit board upper surface.

6. The enclosure of claim 5 wherein said plurality of leg wall members each include a plurality of flexible fingers which are in contact with said printed circuit board metallized ground pad.

7. The enclosure of claim 1 further including an electrically conductive member located between said first enclosure portion upper wall member and said at least one second enclosure portion within said at least one first enclosure portion opening.

8. The enclosure of claim 1 wherein said at least one second enclosure portion further includes a heat sink device.

9. The enclosure of claim 8 wherein said heat sink device includes an air movement device.

10. The enclosure of claim 8 wherein said heat sink device is integrally formed as part of said at least one second enclosure portion.

11. The enclosure of claim 1 wherein said at least one upper wall member opening comprises a plurality of openings and said at least one second enclosure portion comprises a plurality of second enclosure portions.

12. The enclosure of claim 1 further comprising a third enclosure portion including
 a. a lower wall member extending substantially parallel to said printed circuit board, wherein said lower wall member has an upper surface facing said printed circuit board, a lower surface opposite said upper surface and at least one opening therein;

b. a plurality of leg wall members extending transversely from said lower wall member toward a lower surface of said printed circuit board;

c. at least one contact member extending from said lower wall member upper surface toward said printed circuit board lower surface, wherein said at least one contact member is in contact with said at least one secondary component.

13. The enclosure of claim 12 wherein said first enclosure portion is attached to said third enclosure portion.

14. The enclosure of claim 12 further comprising at least one fourth enclosure portion having an upper surface which in contact with said pc board lower surface;

wherein said at least one fourth enclosure portion is located within said at least one third enclosure portion opening and is in electrical contact with said third enclosure portion.

15. The enclosure of claim 14 wherein said at least one fourth enclosure portion is attached to said at least one second enclosure portion.

16. An enclosure mounted on a printed circuit board in proximity to at least one primary electronic component mounted on said printed circuit board, said enclosure comprising:

a first enclosure portion in contact with an upper surface of said printed circuit board and including at least one opening therein located proximate said at least one primary component;

at least one second enclosure portion in contact with said at least one primary component;

wherein at least a portion of said at least one second enclosure portion is located within said at least one first enclosure portion opening and is in electrical contact with said first enclosure portion;

a third enclosure portion in contact with a lower surface of said printed circuit board and including at least one opening therein;

at least one fourth enclosure portion in contact with said printed circuit board lower surface;

wherein at least a portion of said at least one fourth enclosure portion is located within said at least one third enclosure portion opening and is in electrical contact with said third enclosure portion.

17. The enclosure of claim 16 wherein said first enclosure portion is in contact with a metallized ground pad located on said printed circuit board upper surface.

18. The enclosure of claim 17 wherein said first enclosure portion includes a plurality of flexible fingers which are in contact with said printed circuit board metallized ground pad.

19. The enclosure of claim 16 further including an electrically conductive member located between said first enclosure portion and said at least one second enclosure portion within said at least one first enclosure portion opening.

20. The enclosure of claim 16 wherein said at least one second enclosure portion further includes a heat sink device.

21. The enclosure of claim 20 wherein said heat sink device includes an air movement device.

22. The enclosure of claim 16 wherein said at least one first enclosure opening comprises a plurality of openings and said at least one second enclosure portion comprises a plurality of second enclosure portions.

23. The enclosure of claim 16 wherein said first enclosure portion is attached to said third enclosure portion.

24. The enclosure of claim 16 wherein said at least one fourth enclosure portion is attached to said at least one second enclosure portion.

25. A method of enclosing at least one primary electronic component and at least one secondary electronic component which are mounted on a printed circuit board, including the steps of:

providing a first enclosure portion having at least one opening located therein;

mounting said first enclosure portion on a first surface of said printed circuit board and contacting said at least one secondary component with said first enclosure portion to apply a first level of force to said at least one secondary component;

providing at least one second enclosure portion;

placing at least a part of said at least one second enclosure portion within said at least one first enclosure portion opening and contacting said at least one primary component with said at least a part of said at least one second enclosure portion to apply a second level of force to said at least one primary component;

establishing electrical contact between said at least one second enclosure portion and said first enclosure portion.

26. The method of claim 25 wherein said step of contacting said at least one secondary component includes the step of contacting said at least one secondary component with at least one thermal interface pad.

27. The enclosure of claim 25 wherein said step of mounting said first enclosure portion on said printed circuit board includes the step of contacting a metallized ground pad on said pc board with a plurality of flexible fingers which are provided on said first enclosure portion.

28. The method of claim 25 wherein said step of establishing electrical contact between said at least one second enclosure portion and said first enclosure portion includes the step of providing an electrically conductive member between said first enclosure portion and said at least one second enclosure portion within said at least one first enclosure portion opening.

29. The method of claim 25 including the further steps of:

providing a third enclosure portion having at least one opening located therein;

mounting said third enclosure portion on a second surface of said printed circuit board;

contacting said at least one secondary component with said third enclosure portion to apply said first level of force to said at least one secondary component; and attaching said third enclosure portion to said first enclosure portion.

30. The method of claim 29 including the further steps of:

providing at least one fourth enclosure portion;

placing at least a part of said at least one fourth enclosure portion within said at least one third enclosure portion opening and contacting said printed circuit board second surface with said at least a part of said at least one fourth enclosure portion to apply said second level of force to said at least one primary component;

establishing electrical contact between said at least one fourth enclosure portion and said third enclosure portion; and attaching said at least one fourth enclosure portion to said at least one second enclosure portion.

* * * * *